(12) United States Patent
Hedler et al.

(10) Patent No.: US 7,247,948 B2
(45) Date of Patent: Jul. 24, 2007

(54) SEMICONDUCTOR DEVICE AND METHOD FOR FABRICATING THE SEMICONDUCTOR DEVICE

(75) Inventors: Harry Hedler, Germering (DE); Roland Irsigler, München (DE); Thorsten Meyer, Erlangen (DE)

(73) Assignee: Infineon Technologies AG, Munich (DE)

( * ) Notice: Subject to any disclaimer, the term of this patent is extended or adjusted under 35 U.S.C. 154(b) by 133 days.

(21) Appl. No.: 10/836,143

(22) Filed: Apr. 30, 2004

(65) Prior Publication Data

US 2004/0217483 A1    Nov. 4, 2004

(30) Foreign Application Priority Data

Apr. 30, 2003    (DE)  ................ 103 19 538

(51) Int. Cl.
    H01L 21/82    (2006.01)
    H01L 23/48    (2006.01)

(52) U.S. Cl. .................. 257/774; 257/786; 257/678; 257/702; 257/711

(58) Field of Classification Search ............ 252/224, 252/243, 532, 536, 700, 708; 408/106, 48
See application file for complete search history.

(56) References Cited

U.S. PATENT DOCUMENTS 4,897,708 A    1/1990    Clements 6,396,153 B2*   5/2002   Fillion et al. ............... 257/774
2002/0158345 A1* 10/2002   Hedler et al. .............. 257/786
2002/0185730 A1* 12/2002   Ahn et al. .................. 257/723

FOREIGN PATENT DOCUMENTS

| DE | 197 50 559 C1 | 2/1999 |
|---|---|---|
| DE | 100 56 281 A1 | 5/2002 |
| DE | 101 20 408 A1 | 10/2002 |
| WO | 96/13062 | 5/1996 |
| WO | 99/08318 | 2/1999 |

* cited by examiner

*Primary Examiner*—Evan Pert
*Assistant Examiner*—Fazli Erdem
(74) *Attorney, Agent, or Firm*—Laurence A. Greenberg; Werner H. Stemer; Ralph E. Locher

(57) ABSTRACT

A semiconductor device has a semiconductor substrate, at least a first and second rewiring device on a first surface of the semiconductor substrate for the provision of an electrical contact-connection of the semiconductor substrate, and a tapering, continuous opening from a first surface to a second, opposite surface of the semiconductor substrate. At least a third and fourth rewiring device is disposed on the second surface of the semiconductor substrate and a patterned metallization on the side areas of the opening for the separate contact-connection of the first and at least the second rewiring device.

6 Claims, 7 Drawing Sheets

SEMICONDUCTOR DEVICE AND METHOD FOR FABRICATING THE SEMICONDUCTOR DEVICE

BACKGROUND OF THE INVENTION

Field of the Invention

The present invention relates to a semiconductor device and a method for fabricating the semiconductor device, and in particular a vertical multichip module and method for fabricating such a multichip module.

In order to meet the rising requirements made of integrated circuits, chip stacks, i.e. vertical multichip modules are available nowadays. Such vertical multichip modules are produced, in accordance with FIGS. 14A, 14B, 14C, by stacking individual chips or semiconductor substrates 10 on an interconnect substrate 100. A rewiring device 101 is typically provided on the chips or semiconductor substrates 10, the rewiring device having been applied for example by thin-film technology at the wafer level.

In this case, the contact-connection of the chips 10 in the stack may be affected by the chip edges or by feedthroughs within the chip, i.e. inner chip vias. A contact-connection by the chip edge may be provided for example by bonding wires 102 between the rewiring layer 101 on the chip 10 and the interconnect substrate. In the case of a contact-connection through the chip 10, a non-illustrated passage in FIGS. 14A, B, C, e.g. a via, is etched e.g. dry-chemically or wet-chemically into the semiconductor substrate 10 of the chip. Such a via is thereupon passivated and the entire via is subsequently metallized, in a manner similar to a contact pin from one plane to a further plane.

One disadvantage of the method is due to the fact that only a single plated-through hole, i.e. one information line, can be led per passage hole. In practice, this leads to limitations since it is often not possible to etch as many vias as desired within a chip 10 for space, cost or configuration reasons. By way of example, in the case of a conventional DRAM memory chip, the entire chip area is provided with structures. Therefore, there are only few possibilities for accommodating vias. However, there is a higher demand for separate information lines that are to be led through the chip.

Furthermore, the case arises in which identical chips with an identical via layout are intended to be stacked without all the vias being brought into contact-connection in the associated neighboring chips. One example of this can likewise be found in the field of DRAM memory chips, in the case of which a conventional stacking of identical chips leads to the short-circuiting of the chip select contacts. One consequence thereof is that the discrimination function of the individual chips in the case of activation is not possible, i.e. that the different planes of the chip stack cannot be addressed.

SUMMARY OF THE INVENTION

It is accordingly an object of the invention to provide a semiconductor device and a method for fabricating the semiconductor device that overcome the above-mentioned disadvantages of the prior art devices and methods of this general type, which enable more than one information line through a recess or opening, i.e. via, in a semiconductor substrate.

The idea on which the present invention is based essentially in providing a continuous recess with a tapering via wall which serves as a support for the line routing from the rear side of chip to the front side of chip with more than one line per via.

In the present invention, the problem mentioned in the introduction is solved in particular by virtue of the fact that a semiconductor device is provided which has a semiconductor substrate, at least a first and second rewiring device on a first surface of the semiconductor substrate for the providing an electrical contact-connection of the semiconductor substrate, and a tapering, continuous opening running from the first surface to a second, opposite surface of the semiconductor substrate. At least a third and fourth rewiring device are provided on the second surface of the semiconductor substrate and a patterned metallization is provided on the side areas of the opening for the separate contact-connection of the first and at least the second rewiring device.

In accordance with one preferred development, a passivation layer is provided between the patterned metallization with the third and fourth rewiring device, preferably patterned interconnects, and the semiconductor substrate.

In accordance with a further preferred development, above the patterned metallization in the recess, provision is made of at least a second patterned metallization—insulated from the first metallization—for the separate contact-connection of further rewiring devices.

In accordance with a further preferred development, the semiconductor substrate is coupled to a second semiconductor substrate, and at least one rewiring device on the second semiconductor substrate is connected by at least one patterned metallization in the opening of the first semiconductor substrate to a rewiring device on the second surface of the first semiconductor substrate.

In accordance with a further preferred development, the first semiconductor substrate is connected by a mechanical connecting device to the second semiconductor substrate and preferably has a likewise continuous v-shaped or conical opening, on the sidewalls of which at least one patterned metallization is provided.

In accordance with a further preferred development, the opening is formed by a laser device and/or in a plasma step and/or in wet-chemical etching step if appropriate in a serial removal method.

In accordance with a further preferred development, before the application of the patterned metallization and the third and fourth rewiring device, a passivation, preferably made of parylenes, is applied at least in sections, in particular in a plasma CVD step.

In accordance with a further preferred development, the patterned metallization and the third and fourth rewiring device are applied by a sputtering process and/or an electrochemical deposition process. If appropriate, contact openings are produced beforehand in the passivation layer (e.g. by dry-chemical or wet-chemical etching or by laser removal).

In accordance with a further preferred development, the patterned metallization and the third and fourth rewiring device are patterned by a photolithographic process, preferably using electrically depositable photoresist and/or non-electrical deposition of the metallization and/or proximity lithography.

Other features which are considered as characteristic for the invention are set forth in the appended claims.

Although the invention is illustrated and described herein as embodied in a semiconductor device and a method for fabricating a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
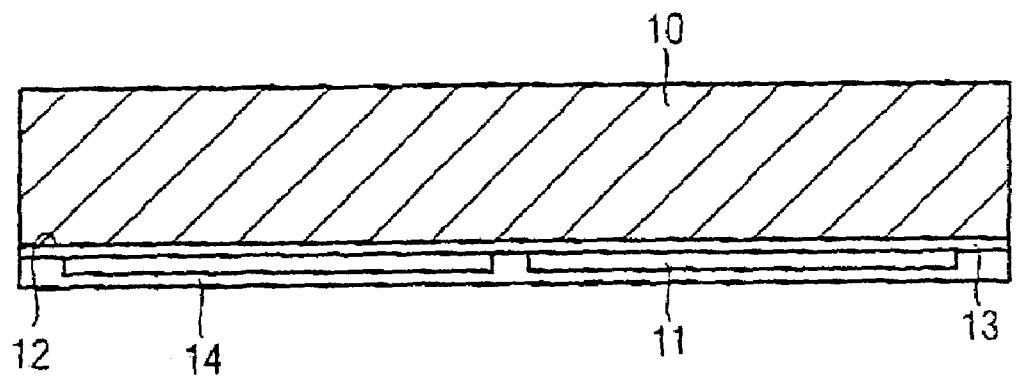
FIGS. 1A, and 2 to 5 are diagrammatic, cross-sectional views of a semiconductor device for elucidating a fabrication method for elucidating a first embodiment according to the invention.

In all the figures of the drawing, sub-features and integral parts that correspond to one another bear the same reference symbol in each case. Referring now to the figures of the drawing in detail and first, particularly, to FIG. 1A thereof, there is shown a semiconductor substrate 10 with a first and second contact and/or rewiring device 11. The contacts and/or rewiring device 11 are/is deposited on a chip passivation 13 on a first chip surface 12 and patterned. The rewiring device 11, for example on the front side 12 of the chip, contains a metallization e.g. made of Au, Cu, Al. It is formed from two separate sections in accordance with FIGS. 1A, 1B. The contact and/or rewiring device 11 is connected to the semiconductor substrate 10, i.e. a non-illustrated terminal region of the semiconductor substrate 10.

A covering layer 14, e.g. made of a polymer or a polyimide, is applied over the contact and/or rewiring device 11.

Figure 1B:
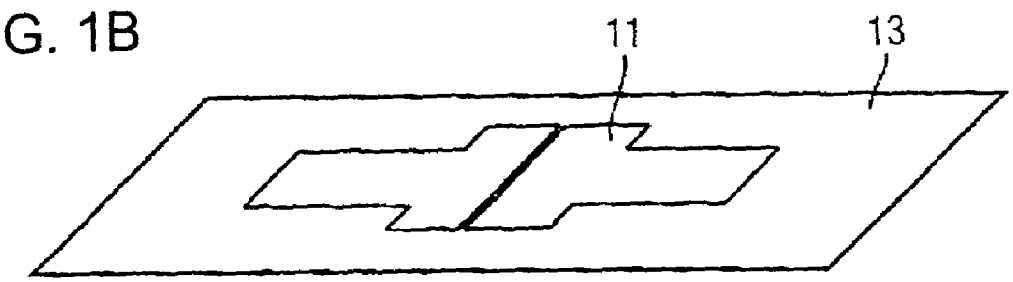
FIG. 1B is a diagrammatic, bottom view of the semiconductor device in accordance with FIG. 1A.

FIG. 1B illustrates the configuration in accordance with FIG. 1A in a bottom view, the illustration showing two T-contact and/or rewiring device elements 11 adjoining one another mirror-symmetrically at the head side on the chip passivation 13.

Figure 2:
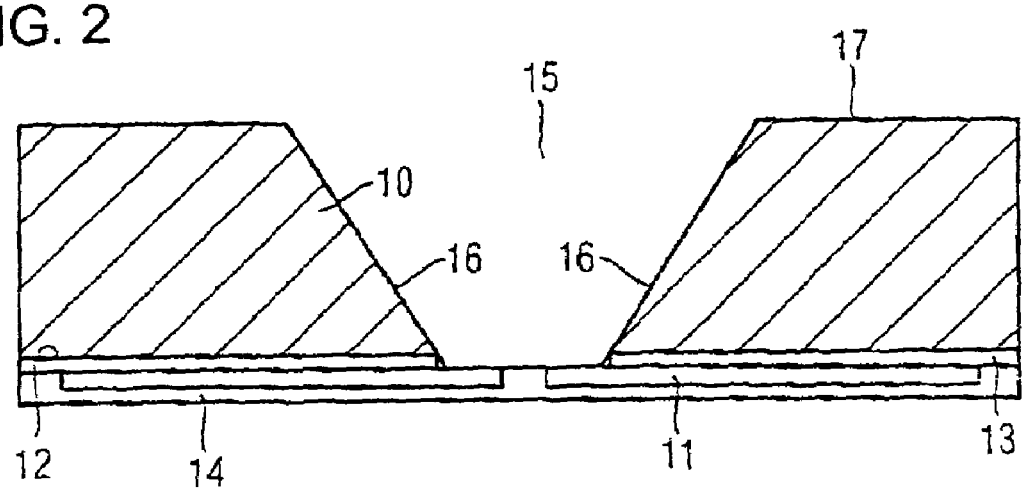

In accordance with FIG. 2, a tapering, in particular a V-shaped or frustoconical or conical recess 15 or opening is formed in the semiconductor substrate 10 with oblique sidewalls 16. The sidewalls 16 are at an angle of between 0 and 90 degrees, preferably between 20 and 70 degrees, with respect to the first chip surface 12. The V-shaped cross section in accordance with FIG. 2 is preferably produced by a laser device and/or in a plasma process and/or a wet-chemical method step if appropriate in a serial removal method. The removal of the recess 15 is selectively stopped at the metalLization of the rewiring device 11. In this way, the contact and/or rewiring device 11 can be reached from a second surface 17 of the semiconductor substrate 10 through the V-shaped recess 15. The second surface 17 of the semiconductor substrate 10 is situated opposite to the first surface 12, i.e. if one side is the front side of the chip, the other side forms the rear side of the chip.

Figure 3:
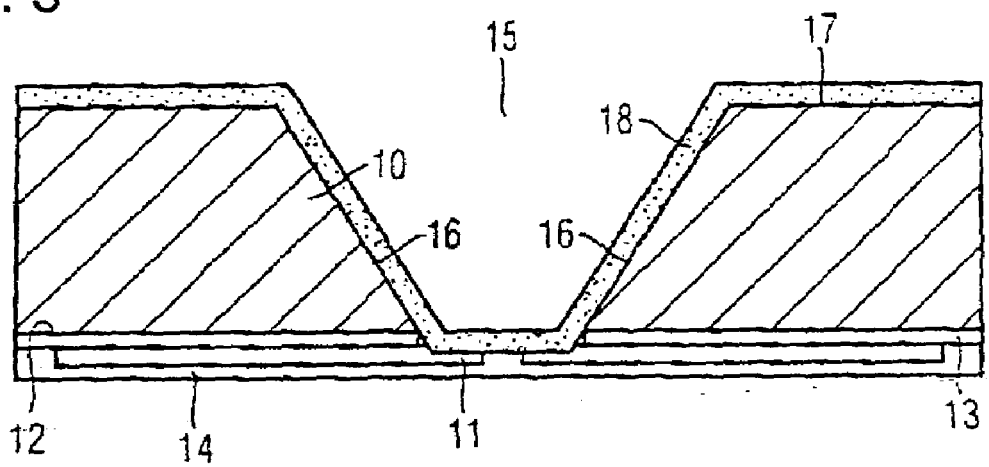

FIG. 3 shows the configuration in accordance with FIG. 2 after the application of a passivation 18 to the second surface 17 including the sidewalls 16 of the recess 15 and also the rewiring device 11. In this case, in particular plasma CVD or else a coating of parylenes is suitable as the passivation material.

Figure 4:
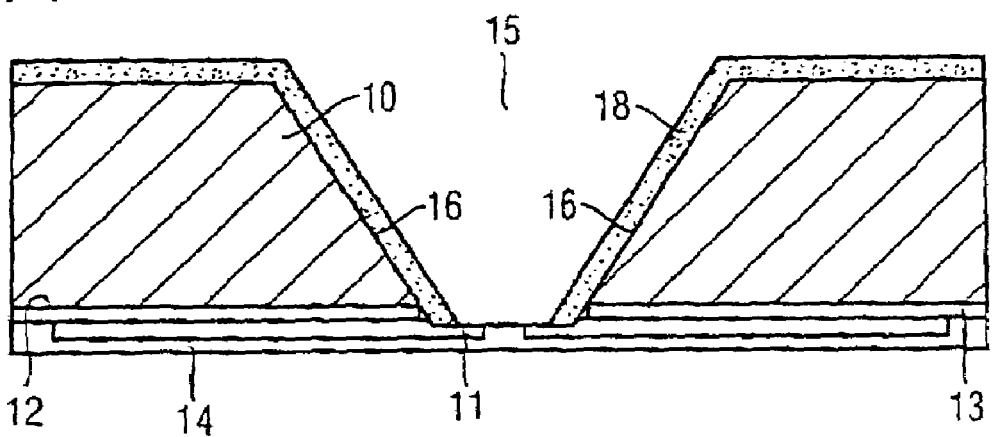

In FIG. 4, the configuration in accordance with FIG. 3 is removed after a removal of the passivation 18 in the region of the rewiring device 11 in order to be able to make electrical contact with the latter from the second surface 17. A photolithographic process with subsequent dry-chemically or wet-chemical etching or a local laser removal may be used for this purpose.

Figure 5:
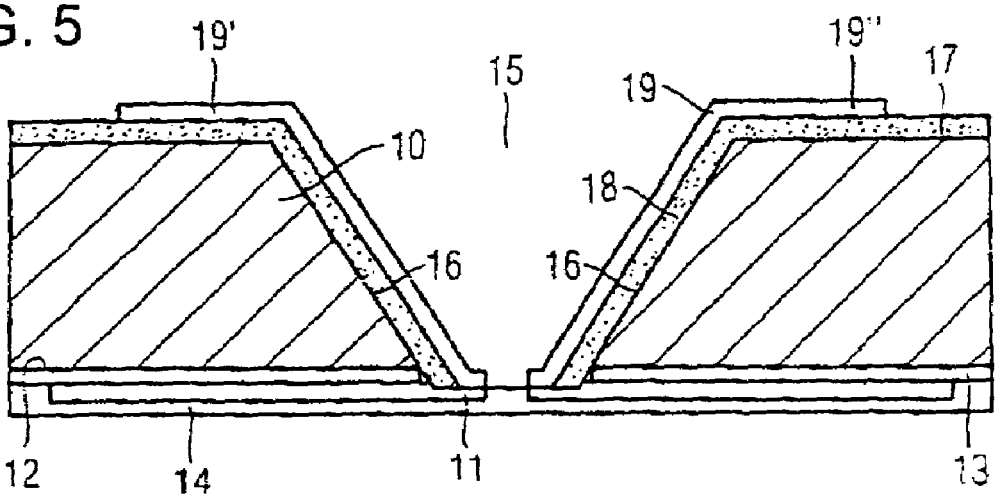

In further process steps, in accordance with FIG. 5, a patterned metallization 19 is thereupon applied from the second surface 17 of the semiconductor substrate 10. One section of the metallization 19 makes contact with a corresponding section of the contact and/or rewiring device 11 and a further section of the metallization 19 makes contact with a section of the contact and/or rewiring device 11 that is correspondingly separate therefrom. The two strands of the metallization 19 as illustrated in accordance with FIG. 5 then run separately along the oblique corresponding sidewalls 16 of the recess 15 as far as a planar section parallel to the surface 17 of the semiconductor substrate 10. The rear side 17 of the chip and the sidewalls 16 are consequently metallized after application of the passivation 18 with patterned interconnects. In this way, a third and fourth rewiring device 19', 19" is formed on the passivated second surface 17 of the semiconductor substrate 10. It is thus possible for more than one contact line to be led at the wall 16 from the rear side 17 of the chip to the front side 12 of the chip.

Such a V-shaped via opening 15 affords the possibility of using conventional methods of metallization such as sputtering and/or electrodeposition, since a good metal deposition is possible through the v-shaped opening in the case of a corresponding aspect ratio. The application of the passivation 18 of patterned metallizations 19 can be repeated as required in order to increase the number of lines per via. In other words, non-illustrated line stacks for the contact-connection of separate contact and/or rewiring devices 11 on the front side 12 of the chip are possible. For the production of relief structures in accordance with the present invention with the recess 15, the application of the photoresist is suitable for a subsequent photolithographic step by an electrical photoresist deposition in a manner similar to electroplating or by electroless plating. These methods enable identical photoresist thicknesses despite the relief structure. A proximity lithography coordinated therewith permits the oblique walls 16 to be exposed in a correspondingly structurally faithful manner.

Figure 6:
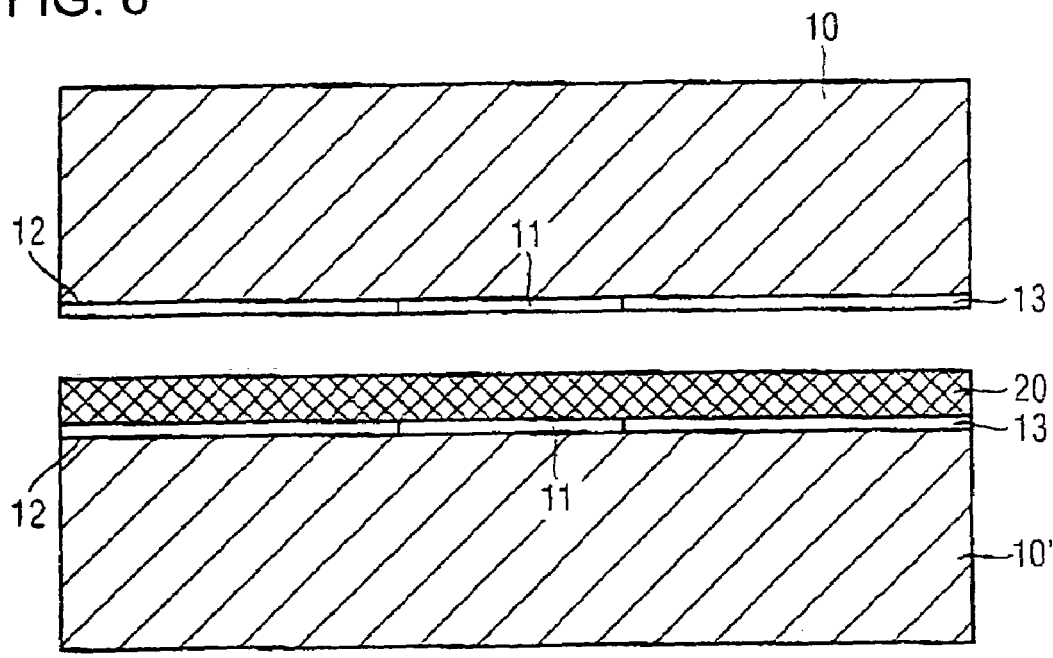
FIGS. 6 to 13 are diagrammatic, cross-sectional views of the semiconductor device for elucidating the fabrication in accordance with a second embodiment according to the invention.

In FIGS. 6 to 13 hereinafter, the present invention in accordance with one embodiment is applied to a chip stack. FIG. 6 illustrates a first semiconductor substrate 10 and a second semiconductor substrate 10' physically separate from one another. The contact device 11, e.g. a metal pad, is applied centrally on the first semiconductor device 10. The contact pad 11 is surrounded laterally by the passivation 13, which covers the first surface 12 of the semiconductor substrate 10 together with the contact pad 11. The second semiconductor device 10' likewise has the contact device 11 and the passivation 13 on the first surface 12. Moreover, a connecting layer 20 is applied over the contact device 11 and the passivation 13 of the second semiconductor device 10'.

Figure 7:
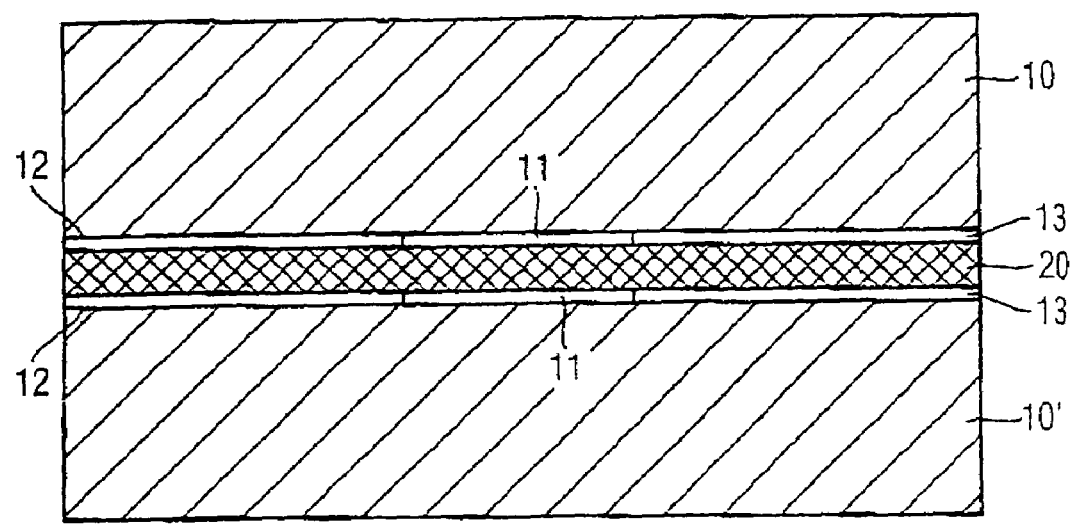

FIG. 7 illustrates the configuration in accordance with FIG. 6 after the orientation and connection of the first and second semiconductor substrate 10, 10' e.g. in each case a wafer (wafer alignment). Both first surfaces 12 of the first and second semiconductor substrate 10, 10' point toward one another in this case. As an alternative, it is also possible for in each case individual semiconductor substrates 10 (individual chips) to be oriented toward one another and stacked onto a larger composite of semiconductor substrates 10' (wafers).

Figure 8:
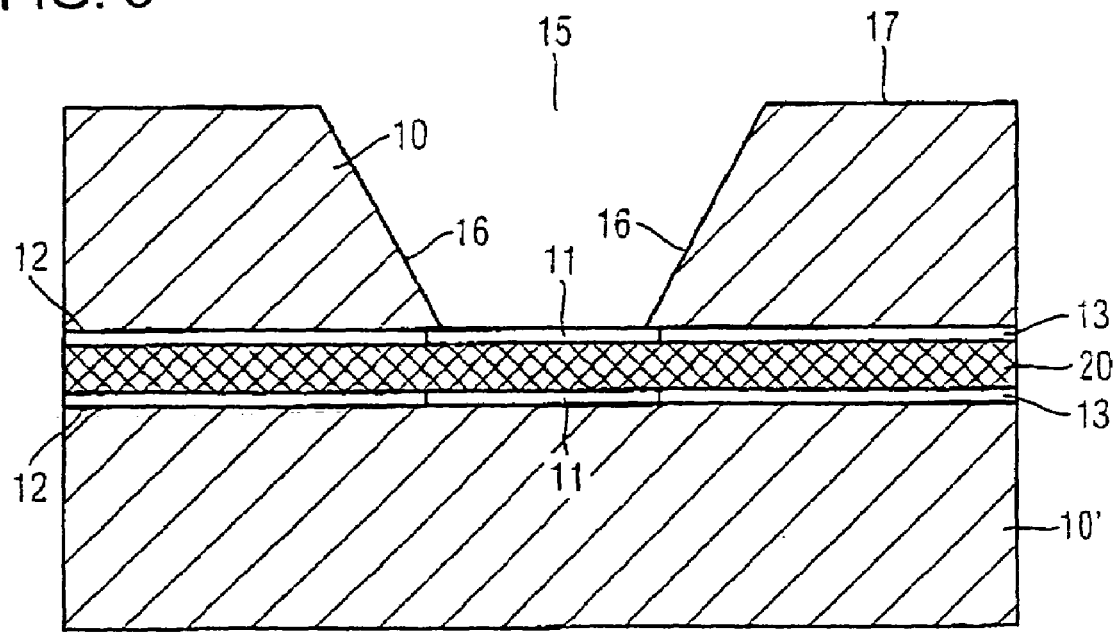

In accordance with FIG. 8, in the first semiconductor device 10, as described previously, a tapering, preferably v-shaped or frustoconical, recess 15 or opening is thereupon formed in the first semiconductor substrate 10.

Figure 9:
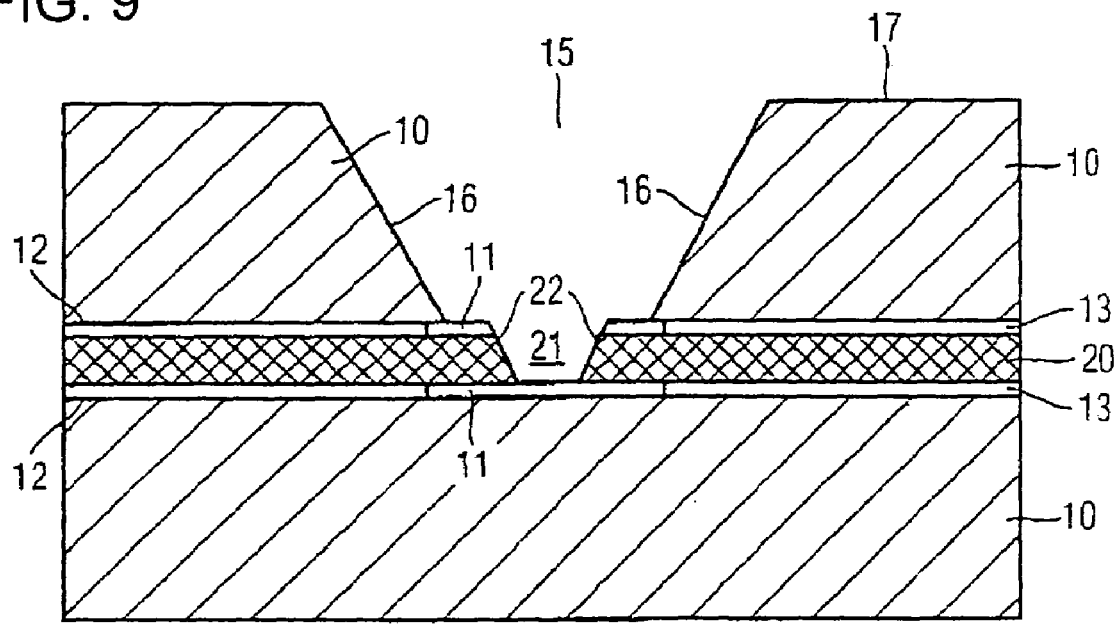

In accordance with FIG. 9, a further tapering, in particular v-shaped or frustoconical recess 21 or opening has been produced in the mechanical connecting device 20 in the chip stack in accordance with FIG. 8. The second contact trench 21 also has preferably oblique sidewalls 22 and is produced in accordance with the first recess 15 as described above.

Figure 10:
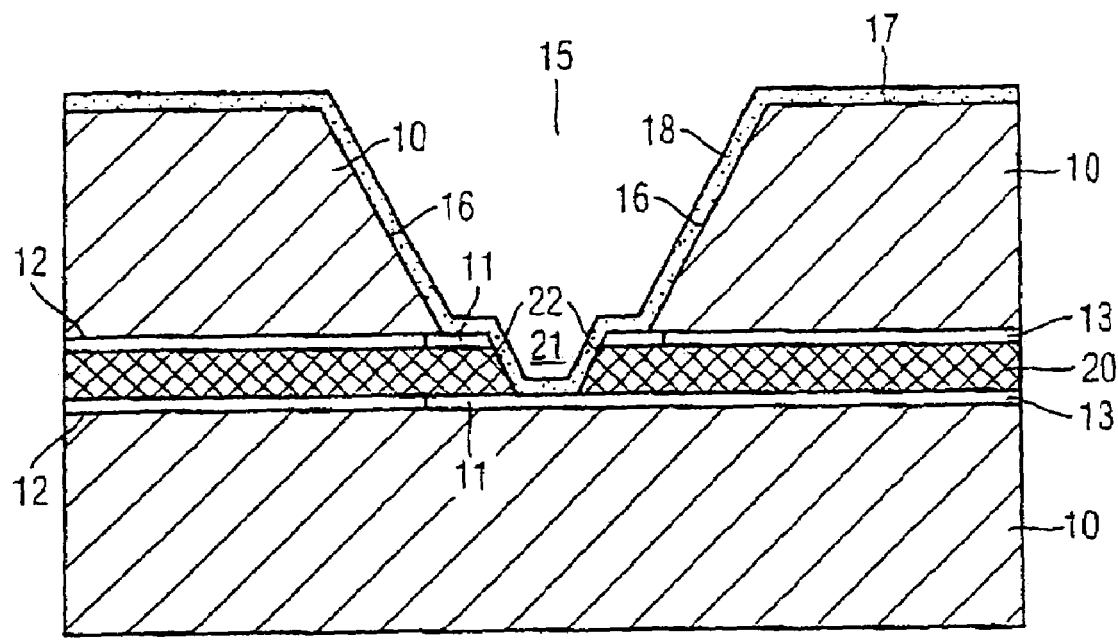

In accordance with FIG. 10, the passivation 18 is thereupon applied to the second surface 17 including the sidewall 16 of the first recess 15 and the sidewall 22 of the second recess 21 onto the chip composite in accordance with FIG. 9.

Figure 11:
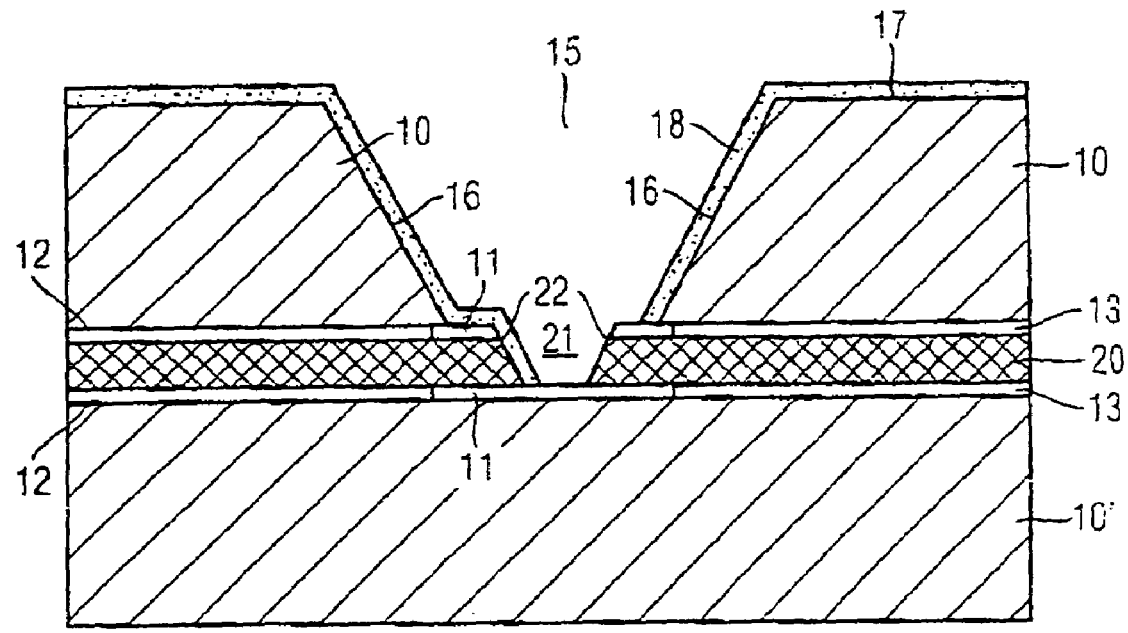

Afterward, in accordance with FIG. 11, the passivation 18 is locally removed for example at the sidewall 22 of the second recess 21 in the connecting layer 20 between the first and second semiconductor device 10, 10'. Such a local opening of the passivation 18 can be generated for example by a photolithographic patterning and a subsequent selective etching step or a selective coating of the passivation layer 18. Moreover, such a local opening of the passivation 18 can be produced by a laser patterning or similar serial removal method.

Figure 12:
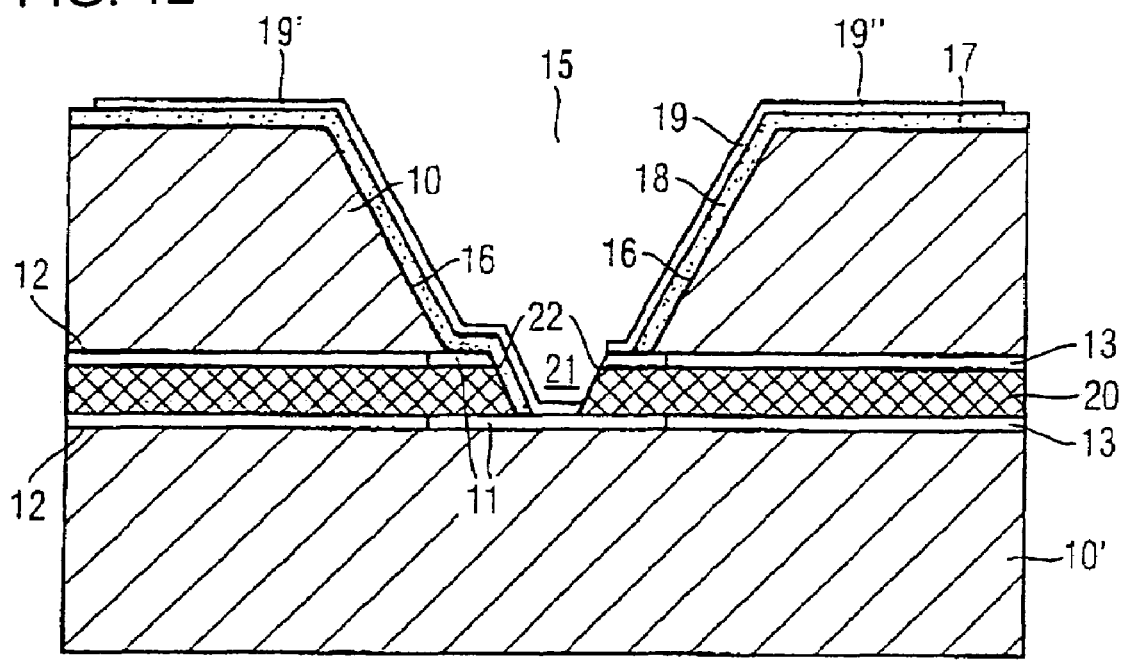

The configuration in accordance with FIG. 12 shows the configuration in accordance with FIG. 11 but with an applied patterned metallization 19 with two branches. The left-hand branch makes contact with the contact device 11 of the second semiconductor substrate 10', whereas the right-hand branch of the patterned metallization 19 makes contact with the contact device 11 at the surface 12 of the first semiconductor substrate 10. Consequently, a separate contact connection is produced for the two contact pads 11 of the first and second semiconductor device 10, 10' in a horizontal configuration on the second surface 17 of the first semiconductor device 10. The separate metallization sections 19 are disposed next to one another, and horizontally separated from one another, as rewiring device 19', 19" at the second surface 17 of the first semiconductor device 10.

Figure 13:
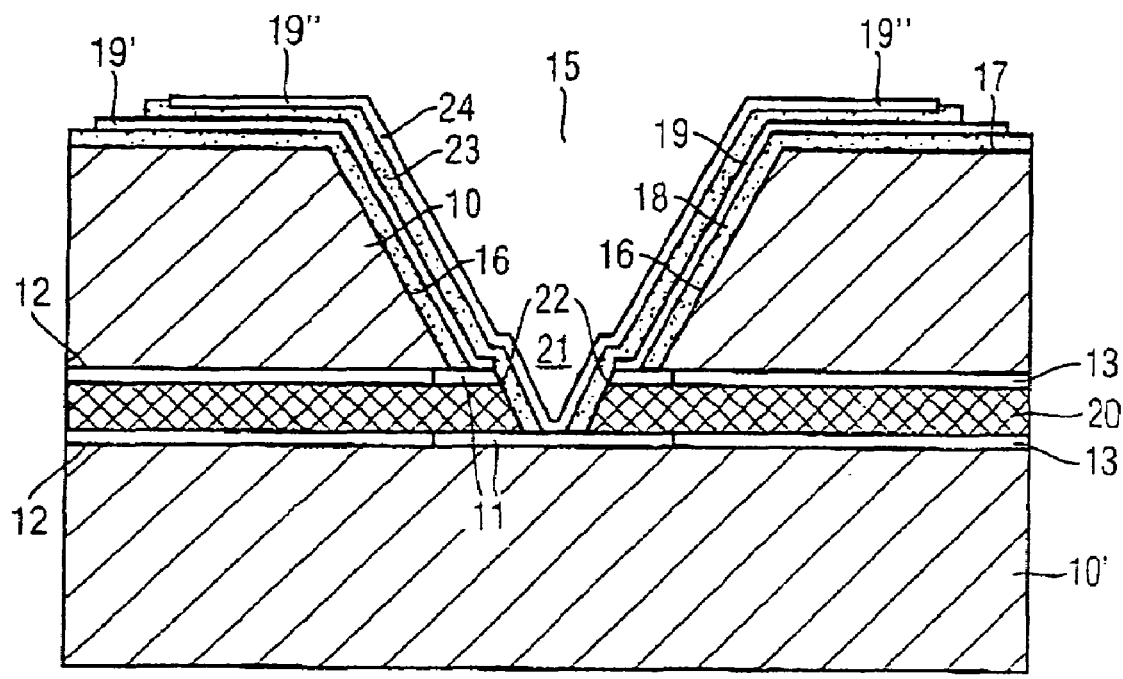
Figure 14A:
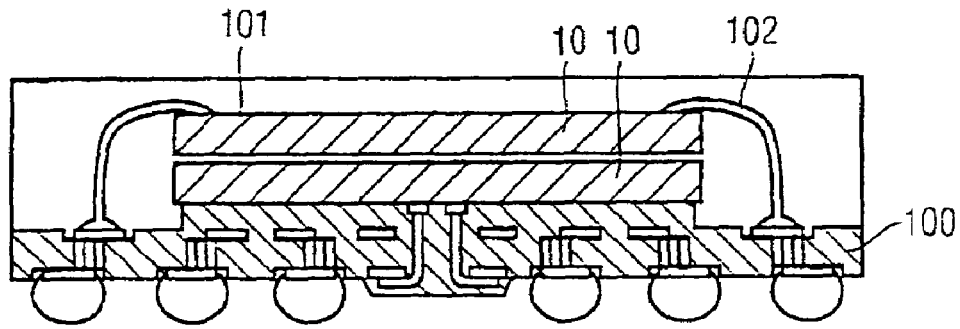
FIGS. 14A to 14C are diagrammatic, cross-sectional views of a semiconductor device known in the prior art.
Figure 14B:
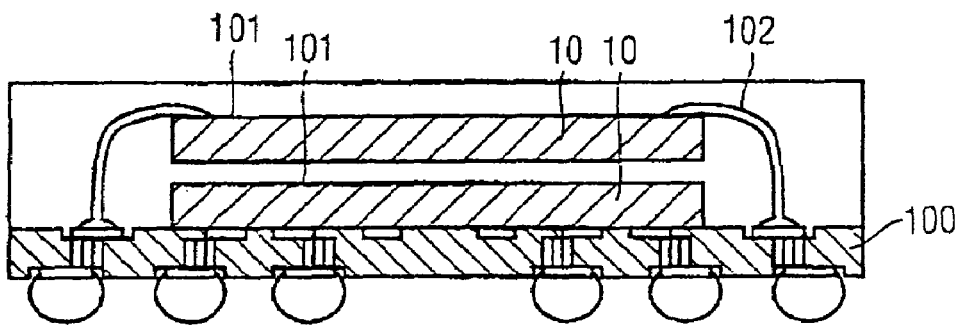
Figure 14C:
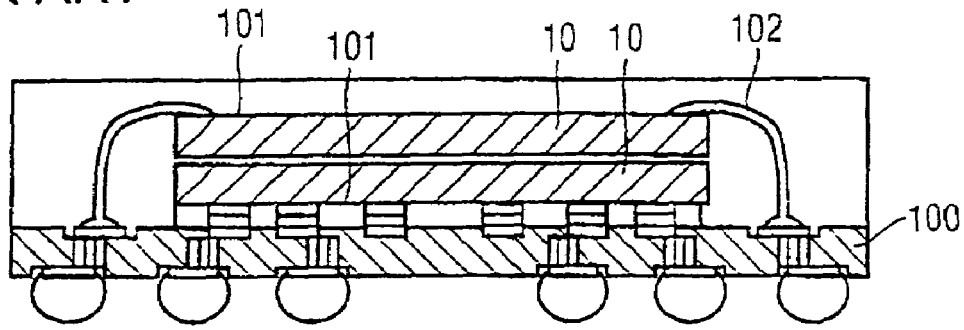

FIG. 13 then shows an alternative embodiment based on the configuration in accordance with FIG. 10. In the configuration according to FIG. 13, the contact device 11 at the first surface 12 of the first semiconductor device 10 is contact-connected to a first metallization 19 and led to the second surface 17 of the first semiconductor device 10 as rewiring device 19'. A second patterned passivation 23 is applied over that and directly insulates the first metallization 19 at least from a second metallization 24. In this case, the first patterned metallization 19 makes contact with the contact device 11 at the first surface 12 of the first semiconductor device 10 and provides a corresponding rewiring device 19' at the second surface 17 of the first semiconductor device 10. The second patterned metallization 24, insulated therefrom, is connected to the contact device 11 of the second semiconductor device 10' by an opening in the second passivation 23 and led to the second surface 17 of the first semiconductor device 10 as further rewiring device 19'''.

In this way, separate rewiring devices 19, 19', 19" are produced for the two contact devices 11 of the first and second semiconductor device 10, 10' in a vertical configuration, separated by the second passivation layer 23. In this case, the separate rewiring devices 19', 19" are disposed one above the other and separated vertically from one another. In this case, as in FIG. 12, too, the production of the separate rewiring devices 19', 19''' for the contact devices 11 of the first and second semiconductor device 10, 10' may be produced by laser patterning or similar serial removal methods.

Although the present invention has been described above on the basis of preferred exemplary embodiments, it is not restricted thereto, but rather can be modified in diverse ways.

Thus, it is possible, in particular, to generate more than two contact pads or contact devices of stacked chips or else of a single chip by a tapered opening according to the invention, since it is also possible to produce further separate interconnects at the sidewalls of the recess in the plane of the drawing by selective removal methods and photolithographic patterning steps. Moreover, the materials disclosed are to be regarded as by way of example. Furthermore, in addition to selective laser removal methods, dry-chemical and wet-chemical etching steps are also possible for selective patterning.

This application claims the priority, under 35 U.S.C. § 119, of German patent application No. 103 19 538.6, filed Apr. 30, 2003; the entire disclosure of the prior application is herewith incorporated by reference.

We claim:

1. A semiconductor device, comprising:
   a first semiconductor substrate having a first surface and a second surface being opposite said first surface, said first semiconductor substrate having a tapering, continuous opening formed therein extending from said first surface to said second surface, said opening defining sidewalls;
   at least first and second rewiring devices disposed on said first surface of said first semiconductor substrate for providing an electrical contact-connection of said first semiconductor substrate;
   at least third and fourth rewiring devices disposed on said second surface of said first semiconductor substrate;
   a first patterned metallization disposed on said sidewalls of said opening for providing separate contact-connection of said first and second rewiring devices; and
   a passivation disposed between said first patterned metallization with said third and fourth rewiring devices and said semiconductor substrate in said opening.

2. The semiconductor device according to claim 1, wherein said first patterned metallization with said third and fourth rewiring devices define patterned interconnects.

3. A semiconductor device, comprising:
   a first semiconductor substrate having a first surface and a second surface being opposite said first surface, said first semiconductor substrate having a tapering, continuous opening formed therein extending from said first surface to said second surface, said opening defining sidewalls;
   at least first and second rewiring devices disposed on said first surface of said first semiconductor substrate for providing an electrical contact-connection of said first semiconductor substrate;
   at least third and fourth rewiring devices disposed on said second surface of said first semiconductor substrate;
   a first patterned metallization disposed on said sidewalls of said opening for providing separate contact-connection of said first and second rewiring devices;

at least a second patterned metallization disposed above said first patterned metallization in said opening for a separate contact-connection of said third and fourth rewiring devices; and an insulator disposed between said first patterned metallization and said second patterned metallization.

4. A semiconductor device, comprising:

a first semiconductor substrate having a first surface and a second surface being opposite said first surface, said first semiconductor substrate having a tapering, continuous opening formed therein extending from said first surface to said second surface, said opening defining sidewalls;

at least first and second rewiring devices disposed on said first surface of said first semiconductor substrate for providing an electrical contact-connection of said first semiconductor substrate;

at least third and fourth rewiring devices disposed on said second surface of said first semiconductor substrate;

a first patterned metallization disposed on said sidewalls of said opening for providing separate contact-connection of said first and second rewiring devices;

a second semiconductor substrate coupled to said first semiconductor substrate;

at least one further rewiring device disposed on said second semiconductor substrate, said first patterned metallization connecting said further rewiring device to said third and fourth rewiring devices on said second surface of said first semiconductor substrate; and a mechanical connecting device connecting said first semiconductor substrate to said second semiconductor substrate.

5. The semiconductor device according to claim 4, wherein said second semiconductor device has a further continuous tapering, opening formed therein and defining further side walls on which said first patterned metallization is disposed.

6. The semiconductor device according to claim 5, wherein said further opening is one of v-shaped and conical shaped.

* * * * *